United States Patent [19]
White

[11] Patent Number: 5,471,396
[45] Date of Patent: Nov. 28, 1995

[54] ESTIMATOR OF AMPLITUDE AND FREQUENCY OF A NOISY-BIASED SINUSOID FROM SHORT BURSTS OF SAMPLES

[75] Inventor: Stanley A. White, San Clemente, Calif.

[73] Assignee: Rockwell International Corporation, Seal Beach, Calif.

[21] Appl. No.: 410,643

[22] Filed: Mar. 24, 1995

Related U.S. Application Data

[63] Continuation of Ser. No. 105,265, Aug. 12, 1993, abandoned.

[51] Int. Cl.⁶ ................................................. G06F 15/20
[52] U.S. Cl. .......................................... 364/480; 364/729
[58] Field of Search ....................... 364/480, 487, 364/724.1, 729, 737; 73/505

[56] References Cited

U.S. PATENT DOCUMENTS

| | | | |
|---|---|---|---|
| Re. 32,931 | 5/1989 | Staudte | 73/505 |
| 4,534,043 | 8/1985 | Krishnan | 364/724 |
| 4,802,766 | 2/1989 | Lundeen et al. | 356/350 |
| 5,056,366 | 10/1991 | Fersht et al. | 73/505 |
| 5,412,472 | 5/1995 | Okada et al. | 356/350 |

OTHER PUBLICATIONS

Chi–Tsong Chen, *One–Dimensional Digital Signal Processing*, Marcel Dekker, Inc., New York, N.Y. (1979), pp. 206–215.

Rabiner and Gold, *Theory and Application of Digital Signal Processing*, Prentice–Hall, Inc., Englewood Cliffs, N.J. (1975), pp. 136–140, 194–204.

*Primary Examiner*—Emanuel T. Voeltz
*Assistant Examiner*—Craig Steven Miller
*Attorney, Agent, or Firm*—George A. Montanye; Charles T. Silberberg; Tom Streeter

[57] ABSTRACT

The amplitude or frequency of a sinusoidal signal represented as sample values $S_1$, $S_2$, $S_3$, $S_4$ is estimated by computing a triplet of differences $x_1$, $x_2$, $x_3$, where $x_1$ is a difference between $S_2$ and $S_1$, $x_2$ is a difference between $S_3$ and $S_2$, and $x_3$ is a difference between $S_4$ and $S_3$. An indication of the estimate of the amplitude or frequency is computed as a ratio of algebraic functions of the differences $x_1$, $x_2$, $x_3$. The amplitude is computed as the square root of a first ratio of algebraic functions, and the frequency is computed as an arc-cosine function of a second ratio of algebraic functions. Preferably the ratio is evaluated by a division operation computed as a polynomial approximation, and the square root function and the arc-cosine function are also computed as a polynomial approximation. Preferably ratios computed from a plurality of triplets are averaged together to give more accurate estimates. Preferably any ratio having a denominator value that has a magnitude less than a threshold value is excluded from the average of the ratios, so that the average will not be corrupted by any inaccurate result that could be obtained when dividing by a relatively small number. The method can be used for compensating a parasitic capacitance, or for monitoring the health of a plurality of signals in an electronic circuit.

26 Claims, 6 Drawing Sheets

ESTIMATOR OF AMPLITUDE AND FREQUENCY OF A NOISY-BIASED SINUSOID FROM SHORT BURSTS OF SAMPLES

This is a Continuation application of application Ser. No. 08/105,265, filed on Aug. 12, 1993, now abandoned.

BACKGROUND OF THE INVENTION

1. Field of the Invention

The present invention relates generally to digital signal processing, and more particularly to signal processing for detecting the amplitude and frequency of a noisy, biased and sparsely-sampled sinusoidal signal.

2. Background Art

A known method of estimating the amplitude of a sampled sinusoidal signal is to compute a "root-mean square" (RMS) value, and then multiply the RMS value by the square root of two. This method, however, is inaccurate when the sinusoid is sparsely sampled and an estimate is obtained from a block of a small number of samples.

SUMMARY OF THE INVENTION

In accordance with a basic aspect of the invention, there is provided a method of estimating the amplitude and frequency of a sinusoidal signal represented as sample values $S_1$, $S_2$, $S_3$, $S_4$ at respective spaced instants in time. The method includes the steps of: computing a triplet of differences $x_1$, $x_2$, $x_3$, where $x_1$ is a difference between $S_2$ and $S_1$, $x_2$ is a difference between $S_3$ and $S_2$, and $x_3$ is a difference between $S_4$ and $S_3$; and computing an estimate (B) of the amplitude, and an estimate (f) of the frequency, of the sinusoidal signal from the triplet of differences. Preferably an indication of the estimate of the amplitude or frequency is computed as a ratio of algebraic functions of the differences $x_1$, $x_2$, $x_3$. The amplitude, for example, is computed as the square root of a first ratio of algebraic functions, and the frequency is computed as an arc-cosine function of a second ratio of algebraic functions. Preferably the ratio is evaluated by a division operation computed as a polynomial approximation, and the square root and the arc-cosine functions are also computed as polynomial approximations.

In accordance with another aspect, the present invention provides a method of obtaining an indication of a characteristic of a signal represented as sample values $(x_1, x_2, x_3, \ldots, x_n)$ at respective spaced instants in time. The method includes the steps computing a series of ratios of algebraic functions of triplets $(x_i, x_{i-1}, x_{i-2})$ of neighboring ones of the sample values, and computing an average of the ratios to produce the indication of the signal characteristic. Preferably any ratio having a denominator value that has a magnitude less than a threshold value is excluded from the average of the ratios, so that the average will not be corrupted by any inaccurate result that could be obtained when diving by a relatively small number.

In accordance with a final aspect, the present invention provides a system for monitoring the health of a plurality of analog signals in an electronic circuit. The system includes an analog multiplexer for scanning the analog signals, an analog-to-digital converter for converting a selected analog signal to a series of digital values, a programmed data processor, and an output unit for indicating an error condition to an operator. The data processor is programmed to operate the analog multiplexer and to receive and process the series of digital values from the analog-to-digital converter. In particular, the data processor is programmed to determine an indication of amplitude and an indication of frequency of each of the analog signals by computing ratios of algebraic functions of at least four samples in the respective series of digital values for each of the analog signals, and to compare the indication of amplitude and the indication of frequency to limit values to indicate the error condition when one of the indications of amplitude and frequency falls outside of boundaries set by the limit values.

BRIEF DESCRIPTION OF THE DRAWINGS

Other objects and advantages of the present invention will become apparent upon reading the following detailed description and upon reference to the drawings, in which.

While the invention will be described in connection with certain preferred embodiments, it is not intended that the invention should be limited to these particular embodiments. On the contrary, the invention is intended to include all modifications, alternatives, and equivalent arrangements as may be included within the scope of this invention as defined by the appended claims.

DETAILED DESCRIPTION OF THE PREFERRED EMBODIMENTS

Figure 1:
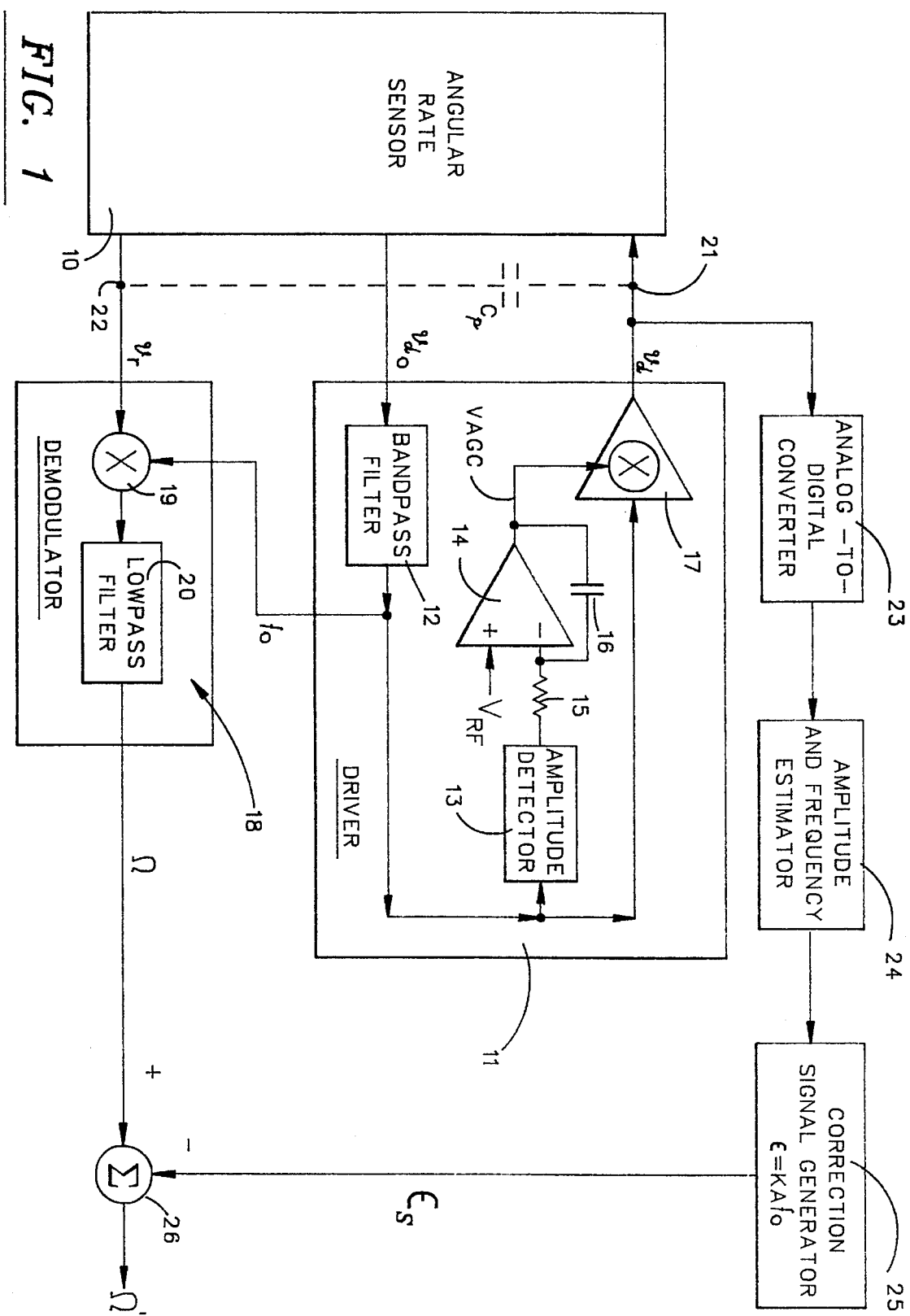
FIG. 1 is a block diagram showing a first method of using the invention, wherein the amplitude and frequency of a sinusoidal signal is estimated in order to provide a predetermined correction for parasitic capacitance in a circuit.

Turning now to the drawings, there is shown in FIG. 1 a block diagram illustrating a first method of using the invention, wherein the amplitude and frequency of a sinusoidal signal is continuously estimated in order to provide a predetermined correction for parasitic capacitance in a circuit. In particular, FIG. 1 shows an angular rate sensor 10 excited by a sinusoidal drive signal $v_d$ at a frequency $f_o$, and producing an output signal $v_{do}$ indicating the level of excitation of the sensor, and a signal $v_r$ including angular rate information. The angular rate information however, appears as a double-sideband suppressed-carrier signal, about a suppressed carrier at the frequency $f_o$. Such an angular rate sensor is described, for example, in Fersht et al. U.S. Pat. No. 5,056,366 and Staudte U.S. Pat. No. Re. 32,931, herein incorporated by reference.

As shown in FIG. 1, the angular rate sensor 10 is excited by a driver circuit generally designated 11 so that the output signal $v_{do}$ has a predetermined amplitude. For this purpose, the signal $v_{do}$ is passed through a bandpass filter 12 to remove noise, and then the amplitude of the signal $v_{do}$ is detected by an amplitude detector 13. An integrating comparator 14, having an associated input resistor 15 and a feedback capacitor 16, compares the amplitude of the signal $v_{do}$ to a predetermined reference $V_R$, to produce an automatic gain control voltage $V_{AGC}$. The automatic gain control voltage $V_{AGC}$ controls the gain of a variable-gain amplifier 17 to produce the exciting drive signal $V_d$.

To detect an angular rate signal $\Omega$, a demodulator circuit 18 includes a balanced modulator 19 that is excited at the frequency $f_o$. The balanced modulator 19 demodulates the signal $v_r$ to produce a base-band signal that is lowpass filtered by a lowpass filter 20 to produce the angular rate signal $\Omega$.

Although not pertinent to the present invention, further details regarding the angular rate sensor 10, the driver 11, and the demodulator 18 can be found in U.S. application Ser. No. 06/105,326 filed Aug. 12, 1993, now U.S. Pat. No. 5,361,036, by the present inventor Stanley A. White, and entitled "COMPLEX DIGITAL DEMODULATOR EMPLOYING CHEBYCHEV-APPROXIMATION DERIVED SYNTHETIC SINUSOID GENERATION," incorporated herein by reference.

In practice, the detected angular rate signal $\Omega$ is a function of the amplitude of the drive signal $v_d$. Although the variation in the detected angular rate signal $\Omega$ with respect to the amplitude of the drive signal vd is rather small, it is significant for some applications, and it is practical to remove the variation by employing the present invention to estimate the amplitude of the drive signal $v_d$. For example, the variation in the detected angular rate signal $\Omega$ with respect to the amplitude of the drive signal $v_d$ can be considered to be caused by a parasitic capacitance $C_p$ between nodes 19 and 20 in FIG. 1. In this case, the error $\epsilon$ in the detected angular rate signal $\Omega$ is approximately:

$$\epsilon = KAf_o \quad \text{(Equation 1)}$$

where K is a predetermined constant, A is the amplitude of the drive signal $v_d$, and $f_o$ is the frequency of the drive signal. The constant K is on the order of $2\pi C_p Z_{in} G$, where $C_p$ is value of the parasitic capacitance, $Z_{in}$ is the impedance at the node 22, and G is the conversion gain of the demodulator 18.

In accordance with an aspect of the present invention, the error $\epsilon$ is determined by estimating at least the amplitude A of the drive signal $v_d$, as further described below. The frequency $f_o$ could also be estimated, but since the frequency $f_o$ is relatively constant in comparison to the amplitude A of the drive signal $v_d$, the frequency $f_o$ need not be estimated, and instead could be assumed to be a fixed, nominal value. The amplitude and/or frequency of the drive signal $v_d$ is estimated by sampling the drive signal with an analog-to-digital converter 23, and processing the samples in an amplitude and frequency estimator 24. The amplitude and frequency estimator 24 will be further described below with reference to FIGS. 3 to 6. A correction signal generator 25 generates a correction signal $\epsilon_s$, based on the estimated amplitude and/or frequency, and an adder unit 26 subtracts the correction signal $C_s$ from the angular rate signal $\Omega$ to produce a corrected angular rate signal $\Omega'$.

Figure 2:
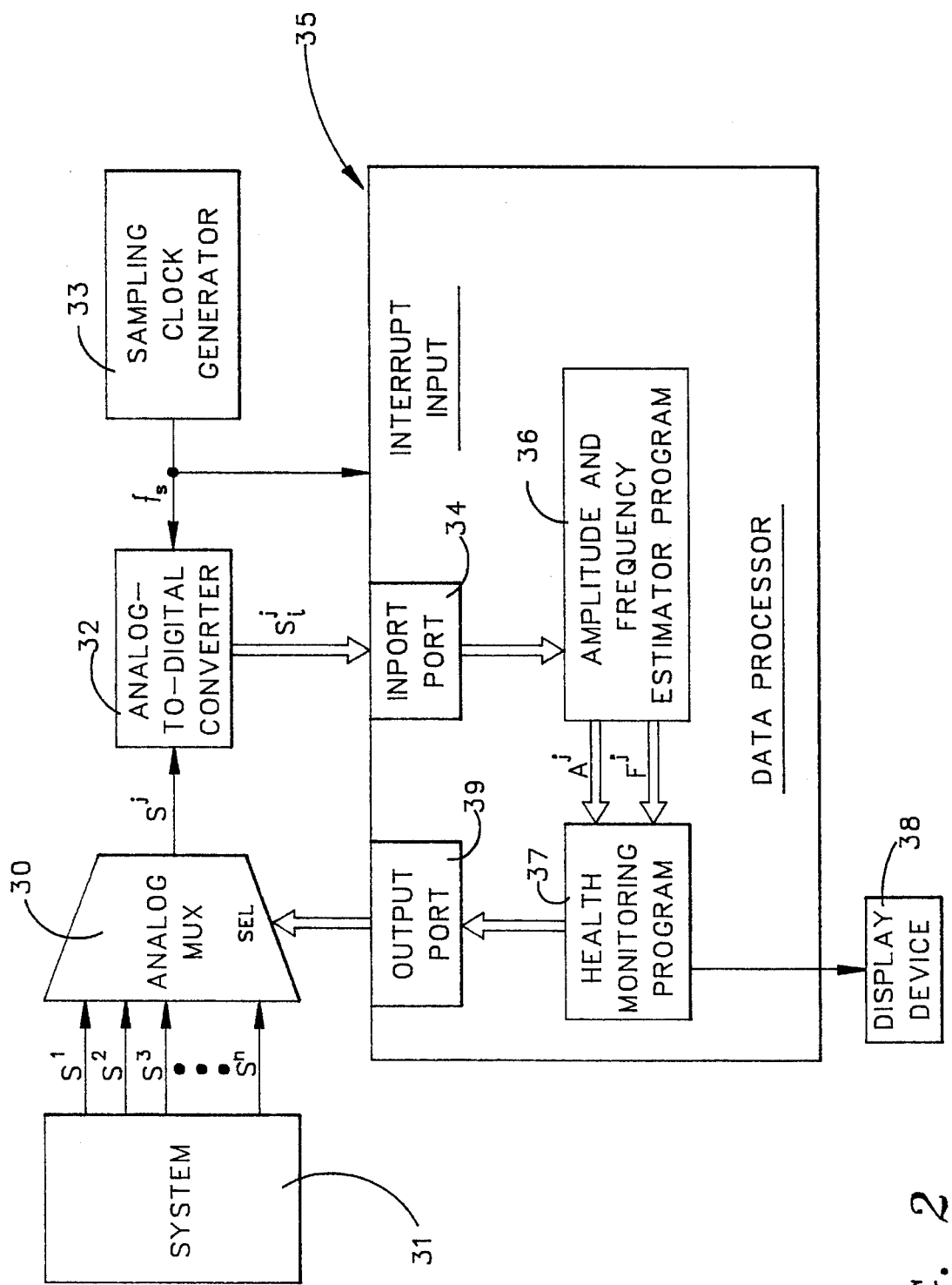
FIG. 2 is a block diagram showing a second method of using the invention, wherein a multiplexer scans a number of signals in a system, and the amplitude and frequency of each selected signal is estimated and compared to predetermined limits in order to monitor the health of the system.

Turning now to FIG. 2, there is shown a block diagram illustrating a second method of the invention, wherein an analog multiplexer 30 scans a number of signals $S^1, S^2, S^3, \ldots, S^n$ from a system 31, and the amplitude and frequency of each selected signal is estimated and compared to predetermined limits in order to monitor the health of the system. The system 31, for example, is an inertial measurement unit including three angular rate sensors as described above with reference to FIG. 1, each of the angular rate sensors have an associated driver circuit and detector circuit, and each of the angular rate sensors sense the angular rate of rotation about a respective one of three orthogonal axes. In this case the signal $S^i$ could be the drive signal $v_d$ for the ith one of the angular rate sensors, and the amplitude and/or frequency estimate for each of the drive signals could also be used for correction of the angular rate signal $\Omega$ from each of the angular rate sensors.

As shown in FIG. 2, the multiplexer 30 selects the signal $S^j$, and the selected signal is periodically sampled by an analog-to-digital converter 32 at a sampling rate $f_s$ set by a sampling clock generator 33. The values of the samples are received at an input port 34 of a data processor 35. The data processor is interrupted at the sampling rate $f_s$ to receive the values of the samples from the analog-to-digital converter 32. An amplitude and frequency estimator program B6 controls the data processor 35 to receive a block of the sampled values, and to estimate the amplitude $A^j$ and the frequency $f^j$ of the sampled signal $S^j$. A health monitoring program 37 controls the data processor 35 to compare the amplitude and frequency estimates to respective predetermine limits to monitor the health of the system. When the estimated amplitude or frequency is found to be outside the bounds of the predetermined limits, the data processor 35 operates a display device 36 to display an error message to an operator (not shown). The health monitoring program 37 then controls the data processor to change a selection signal from an output port 39 so that the analog multiplexer 30 selects a different one of the signals $S^1, S^2, S^3, \ldots, S^n$.

In a specific example, the signals $S^1, S^2, S^3, \ldots, S^n$ each have a frequency of about 10 kilohertz, and the sampling rate is 42 kilohertz. The analog-to-digital converter is an Analog Devices part No. AD676 16-bit 100 kSPS sampling ADC which uses a switched-capacitor/charge redistribution architecture to achieve a 10 microsecond total conversion time. The data processor 35 is a Star Semiconductor SPROC programmable digital signal processing (DSP) integrated circuit which is designed for 24-bit arithmetic. In this system, the method of the present invention provides both amplitude and frequency estimates using a modest amount of computation and with errors on the order of parts per million.

Because the sampling rate $f_s$ is only about four (sometimes as low as three) times the frequency of the sinusoidal signals $S^1, S^2, S^3, \ldots, S^n$, the sinusoidal signals are sparsely sampled. The amplitude and frequency estimation method of the present invention, however, provides an accurate estimate of the amplitude and frequency of such a sparsely sampled sinusoidal signal. The method of the present invention can also provide amplitude and frequency estimates based on as few as four samples of a sparsely sampled signal, in the presence of a DC bias.

Consider first the simplified case of a sinusoid without a DC bias. Assuming that the sinusoid has an amplitude A, a frequency $\omega_o$, and a phase angle $\phi$, and assuming that the sampling frequency $f_s$ has a period $T=1/f_s$, then the $n^{th}$ signal sample $x_n$ has a value of:

$$x_n = A \sin(\omega_o nT + \phi) \quad \text{(Equation 2)}$$

Since there are three unknowns in Equation 2, it should be possible to extract the amplitude A and a function of the frequency $F = \cos \omega_o T$ from three samples of the sinusoidal signal. The two neighboring samples $x_{n+1}$ and $x_{n-1}$ are:

$$X_{n+1}=A \sin(\omega_o nT+\phi) \cos(\omega_o T)+A \cos(\omega_o nT+\phi) \sin(\omega_o T) \quad \text{(Equation 3)}$$

$$X_{n-1}=A \sin(\omega_o nT+\omega) \cos(\omega_o T)-A \cos(\omega_o nT+\omega) \sin(\omega_o T) \quad \text{(Equation 4)}$$

The function of frequency F is extracted from the three samples $x_n$, $x_{n+1}$ and $x_{n-1}$ by adding Equations 3 and 4 together, and dividing the sum by Equation 2, to provide:

$$F = \cos\omega_o T = \frac{x_{n+1}+x_{n-1}}{2x_n} \quad \text{(Equation 5)}$$

The amplitude A is extracted by subtracting the product of Equation 3 and Equation 4 from the square of Equation 2, to provide:

$$x_n^2 - x_{n+1} x_{n-1} = A^2 \sin^2\omega_o T \quad \text{(Equation 6)}$$

Applying the trigonometric identity $1=\cos^2\alpha+\sin^2\alpha$ to Equation 5 gives:

$$1 - \left(\frac{x_{n+1}+x_{n-1}}{2x_n}\right)^2 = \sin^2\omega_o T \quad \text{(Equation 7)}$$

Dividing Equation 6 by Equation 7 gives:

$$A^2 = \frac{x_n^2 - x_{n+1}x_{n-1}}{1 - \left(\frac{x_{n+1}+x_{n-1}}{2x_n}\right)^2} = \frac{4x_n^2(x_n^2 - x_{n+1}x_{n-1})}{4x_n^2 - (x_{n+1}+x_{n-1})^2} \quad \text{(Equation 8)}$$

A direct implementation of Equation 8 to solve for the amplitude A therefore requires four multiplies, 3 adds, and 1 divide.

Consider now the more complicated problem of finding the amplitude of a sinusoidal signal superimposed on a DC bias. The signal becomes:

$$Y_n = DC + B \sin(\omega_o nT+\omega) \quad \text{(Equation 9)}$$

Since there are now four unknowns, at least four samples are needed to determine the amplitude B and function of frequency $F=\cos\omega_o T$. The DC bias is eliminated by taking the differences $x_n$ between successive signal samples $y_n$ and $y_{n-1}$ as follows:

$$\begin{aligned} x_n &= y_m - y_{n-1} \quad \text{(Equation 10)}\\ &= B[\sin(\omega_o nT+\phi) - \sin([\omega_o(n-1)]T+\phi)]\\ &= B[\sin(\omega_o nT+\phi) - \sin(\omega_o nT+\phi)\cos\omega_o T + \cos(\omega_o nT+\phi)\sin\omega_o T]\\ &= B[\sin(\omega_o nT+\phi)(1-\cos\omega_o T) + \cos(\omega_o nT+\phi)\sin\omega_o T]\\ &= B\sqrt{2-2\cos\omega_o T} \; \sin(\omega_o nT+\Theta) \end{aligned}$$

where $$\Theta = \phi + \tan^{-1}\left(\frac{\sin\omega_o T}{1-\cos\omega_o T}\right)$$

The DC biased sinusoid problem has been transformed to a mathematical form similar to the case without DC bias, except Equation 10 needs to be solved for B. But by comparison:

$$A = B\sqrt{2-2\cos\omega_o T} \quad \text{(Equation 11)}$$

so that:

$$B = \frac{A}{\sqrt{2-2F}} \quad \text{(Equation 12)}$$

or:

$$B^2 = \frac{A^2}{2-2F} = \frac{2x_n^2}{1-F} \frac{x_n^2 - x_{n+1}x_{n-1}}{(2x_n)^2 - (x_{n+1}+x_{n-1})^2} \quad \text{(Equation 13)}$$

Solving Equations 6 and 7 for F gives:

$$F = \frac{x_{n+1}+x_{n-1}}{2x_n} \quad \text{(Equation 14)}$$

Eliminating F from Equation 14 gives:

$$B^2 = \frac{4x_n^3(x_n^2 - x_{n+1}x_{n-1})}{[2x_n - (x_{n+1}+x_{n-1})][(2x_n)^2 - (x_{n+1}+x_{n-1})^2]} \quad \text{(Equation 15)}$$

Factoring and re-grouping the terms in the denominator of Equation 15 gives an equivalent expression for the amplitude B:

$$B^2 = \frac{4x_n^3(x_n^2 - x_{n+1}x_{n-1})}{[2x_n - (x_{n+1}+x_{n-1})]^2[(2x_n)+(x_{n+1}+x_{n-1})]} \quad \text{(Equation 16)}$$

Figure 3:
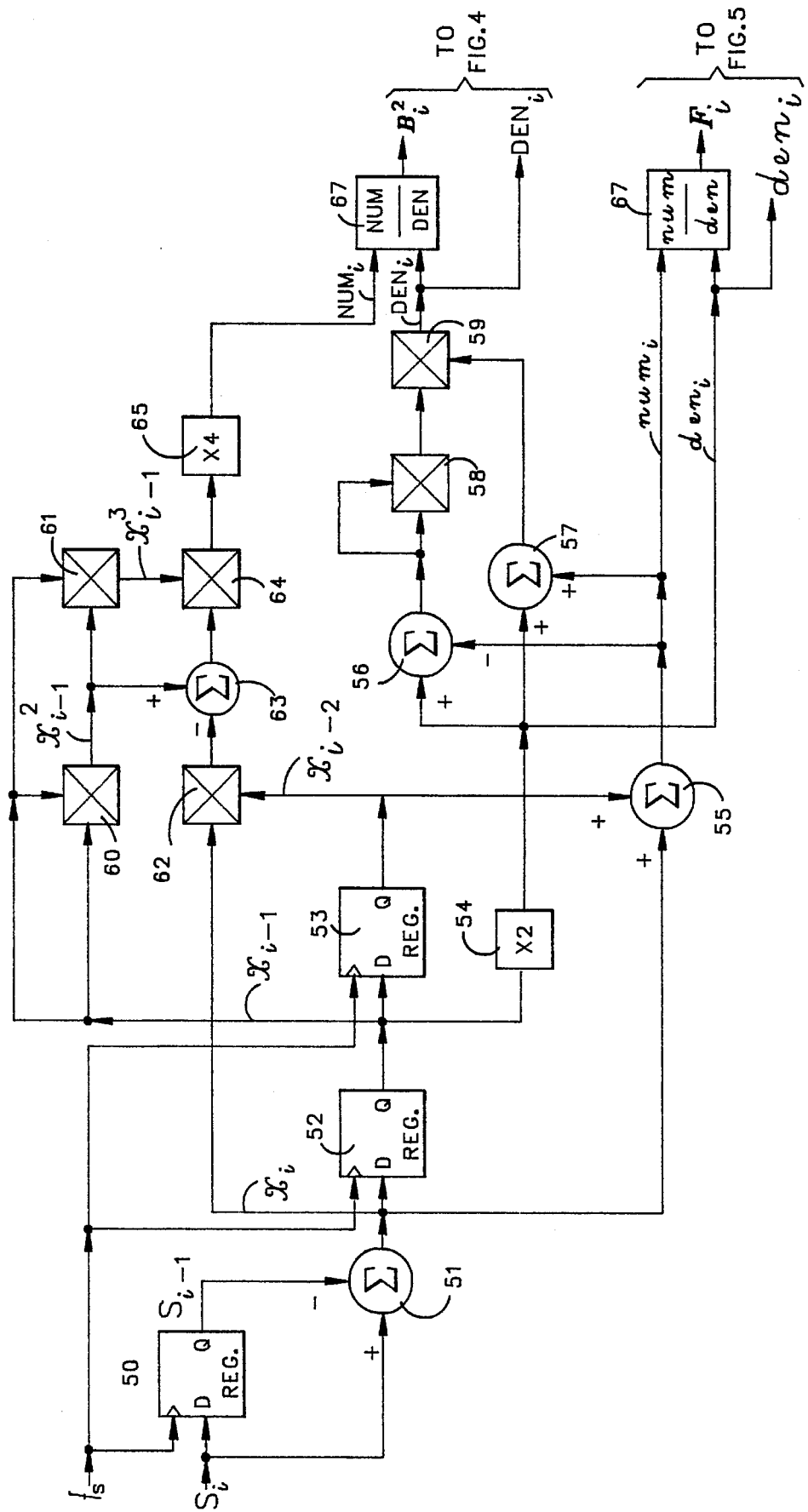
FIG. 3 is a first portion of a flow diagram showing the present invention implemented for continuously estimating the amplitude and frequency of a sampled sinusoidal signal.
Figure 4:
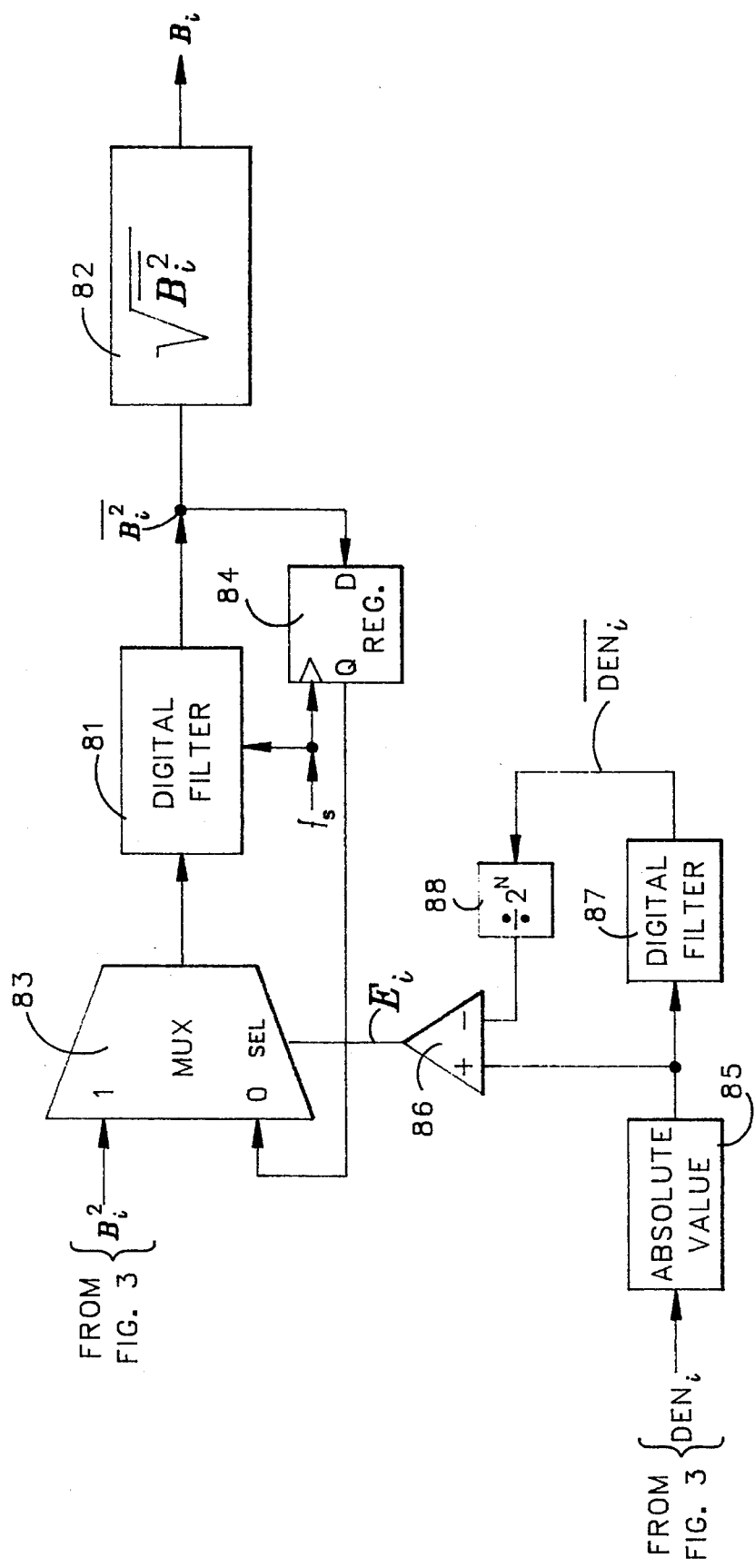
FIG. 4 is a second portion of a flow diagram showing the present invention implemented for continuously estimating the amplitude an frequency of a sampled sinusoidal signal.
Figure 5:
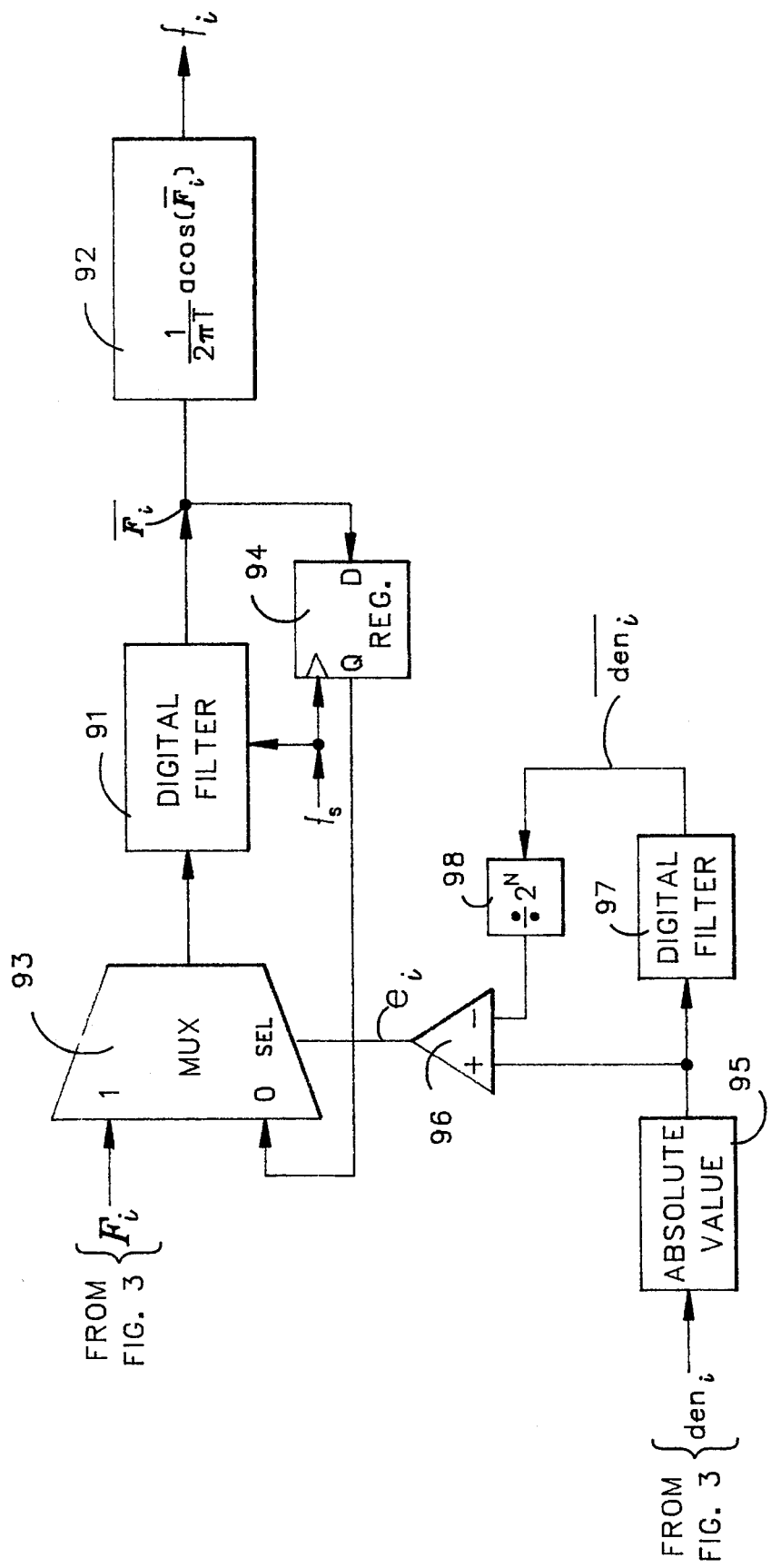
FIG. 5 is a third portion of a flow diagram showing the present invention implemented for continuously estimating the amplitude and frequency of a sampled sinusoidal signal.

Turning now to FIGS. 3, 4, and 5, there is shown a flow graph of a specific procedure implementing Equations 14 and 16 above. This flow graph represents the solution procedure in a form similar to the representation for a digital filter, and indeed the elements in FIGS. 3, 4, and 5 could be individual computational hardware elements. Alternatively, the functions represented by the elements in FIGS. 3, 4, and 5 could be performed by a programmed digital data processor.

As shown in FIG. 3, the sampled signal $S_i$ is delayed by one sample period T in a register 50 to produce the delayed sample $S_{i-1}$. A subtractor 51 subtracts the delayed sample $S_{i-1}$ from the sample $S_i$ to produce a difference $x_i$. The difference $x_i$ is delayed by a first sample period T in a second register 52 to provide a delayed difference $x_{i-1}$, and is delayed for a second sample period T in a third register 53 to produce a doubly-delayed difference $x_{i-2}$.

To compute the denominator of Equation 14, the delayed difference $x_{i-1}$ is scaled by a factor of two, as represented by a box 54, which could left-shift the delayed difference by one binary place. To produce the numerator (num$_i$) of Equation 14, an adder 55 adds the difference $x_i$ to the doubly-delayed difference $x_{i-2}$.

To compute the denominator (DEN$_i$) of Equation 16, a subtractor 56 computes the difference (den$_i$−num$_i$), and an adder 57 computes the sum (den$_1$+num$_i$). A multiplier 58 squares the difference from the subtractor 56, and a multiplier 59 multiplies the square by the sum from the adder 57 to produce the denominator DEN$_i$ of Equation 16.

To compute the numerator (NUM$_i$) of Equation 16, a multiplier 60 computes the square of the delayed difference $x_{i-1}$, and a multiplier 61 computes the cube of the delayed difference $x_{i-1}$. A multiplier 62 computes the product of the difference $x_i$ and the doubly-delayed difference $x_{i-2}$. A subtractor 63 computes the difference between the square from the multiplier 60 and the product from the multiplier 62. A multiplier 64 computes the product of the difference from the subtractor 63 and the cube from the multiplier 61. The product from the multiplier 64 is scaled by a factor of four as indicated in a box 65, which could represent a left-shift by two binary places, to produce the numerator $NUM_i$ of Equation 16.

A divider 66 computes the quotient $F_i$ of Equation 13, and a divider 67 computes the quotient $B_i^2$ of Equation 15. The division performed by the divider units 66, 67 preferably is a polynomial approximation as derived in Appendix I.

Continuing now in FIG. 4 the values of $B_i^2$ are filtered in a digital filter 81 to determine average values $\overline{B}_i^2$. The digital filter 81, for example, is a non-recursive digital filter including a shift register storing the values $B_{i-1}^2$, $B_{i-2}^2$, and $B_{i-3}^2$ and computing the sum of $B_i^2$ and these three values and dividing the sum by four, by a right-shift by two binary places, to provide an average value $\overline{B}_i^2$. The square root of this average value is computed by a computational unit 82. The computational unit 82, for example, performs a square root operation by a polynomial approximation as derived in Appendix II. The result of the square root operation is an estimate $B_i$ of the amplitude of the sampled sinusoidal signal. S.

The division operation performed by the divider 76 in FIG. 3 may give an inaccurate result when the value of the denominator $DEN_i$ is approximately zero. To prevent such inaccurate results from corrupting the amplitude estimate $B_i$, the inaccurate values of $B_i^2$ can be excluded so as not to be averaged by the digital filter 81. For this purpose, a digital multiplexer 83 selects either the value $B_i^2$ from the division unit 67 in FIG. 3, or selects the previous average value computed by the digital filter 81. The previous average value computed by the digital filter 81 is obtained from a register 84, that is clocked at the sampling frequency $f_s$. To determine when the value $B_i^2$ may be erroneous, the value $DEN_i$ of the divisor for the division unit 67 is received by an absolute value unit 85 that determines the magnitude of the divisor value DENi. A comparator 86 compares this magnitude to a certain fraction of the average value of the divisor value. A digital filter 87, which may be similar to the digital filter 81, computes the average of the divisor value, and a shifter 88 right-shifts the average divisor value by N binary places to compute a predetermined fraction of the average of the divisor value. The value of N, for example, is three.

Turning now to FIG. 5, it is seen that the quotient $F_i$ of Equation 13 is processed in a similar fashion to the processing of the quotient $B_i^2$ as shown in FIG. 4, by a digital filter 91, a functional unit 92, a multiplexer 93, a register 94, an absolute value unit 95, a comparator 96, a digital filter 97, and a right-shifter 98, that are similar to the corresponding components 81 to 87 in FIG. 4. The functional unit 92 in FIG. 5, however, computes an arc-cosine function $((\frac{1}{2}\pi T)\text{acos}(\overline{f}_i))$. The functional unit 92 preferably computes this arc-cosine function as a polynomial approximation, as derived in Appendix III.

In practice, the estimates of amplitude $B_i$ and frequency $f_i$ are relatively correlated between the neighboring ith and i+1th values. Therefore, it is possible to reduce the computational requirements of obtaining an estimate with only a slight decrease in performance by computing an amplitude estimate B and frequency estimate f from non-overlapping triplets of differences, rather than by computing the estimates from overlapping triplets of differences as illustrated in FIGS. 3, 4, and 5. In other words, although the computations illustrated in FIGS. 3, 4, and 5 can provide the best performance and provide a new estimate of the amplitude $B_i$ and $f_i$ at each sampling instant, the computational requirements for computing such estimates at each sampling instant are rather burdensome because all of the computations shown in FIGS. 3, 4, and 5 must be performed over each sampling period T. For monitoring the health of signals in a system as illustrated in FIG. 2, for example, it is not necessary to compute a new estimate of amplitude or frequency for each sampling instant. Therefore, the computational requirements for monitoring the health of signals in a system as shown in FIG. 2 can be considerably relaxed by performing the computations illustrated in FIG. 3 over non-overlapping triplets of differences, and by performing the digital filtering and square root or arc-cosine function from the ratios computed from a number of non-overlapping triplets of differences.

Figure 6:
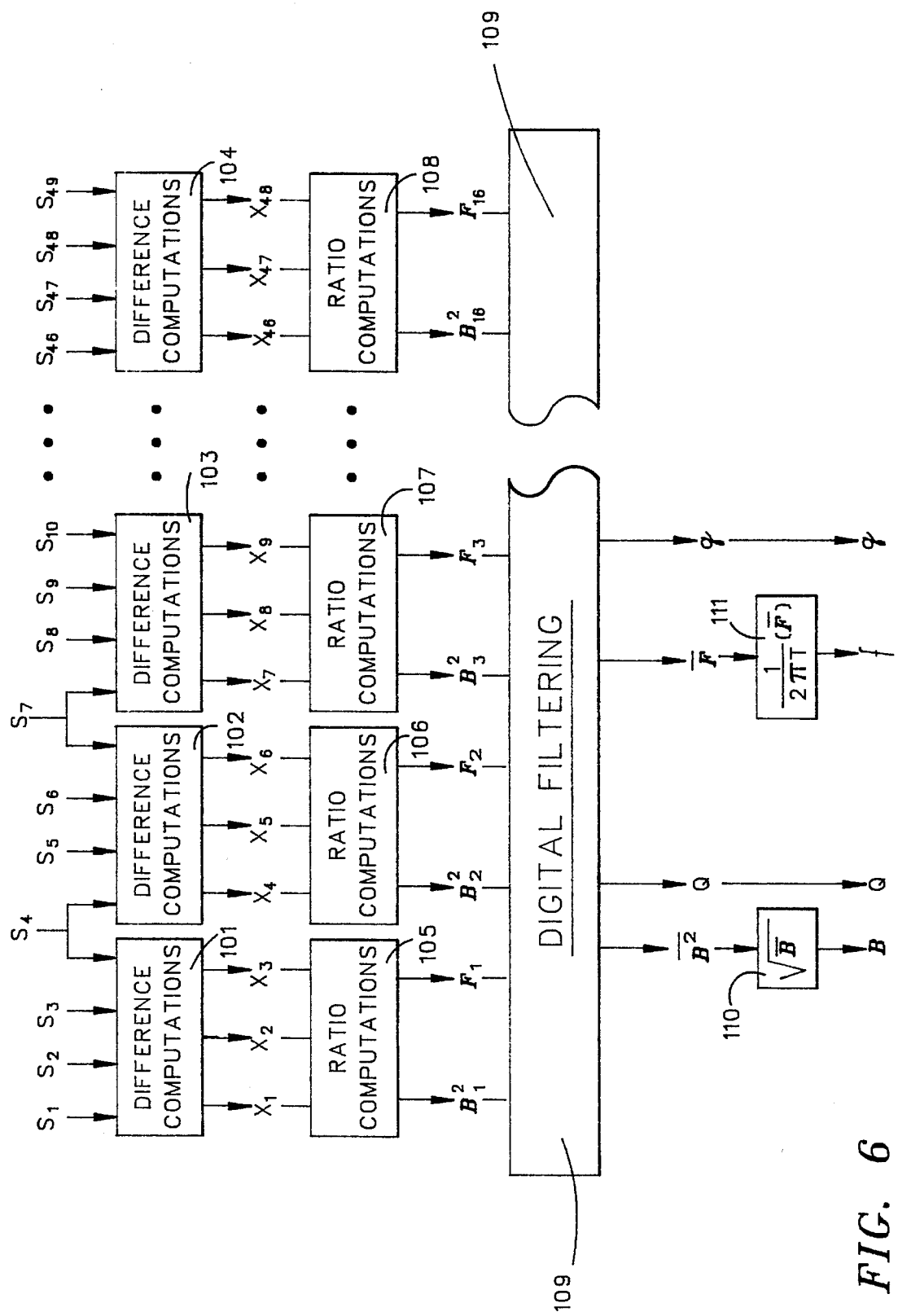
FIG. 6 is block diagram showing the present invention implemented for obtaining an estimate of amplitude and frequency from a block of samples of a sinusoidal signal.

Turning now to FIG. 6, there is shown a flow diagram for the computations that are preferably performed for the system of FIG. 2 in the data processor 35. As illustrated in FIG. 6, an amplitude estimate B and a frequency estimate f are obtained from 16 non-overlapping triplets of differences $x_1, x_2, x_3; x_4, x_5, x_6; x_7, x_8, x_9; \ldots; x_{46}, x_{47}, x_{48}$. The triplets of differences are the results of difference computations 101, 102, 103, . . . 104, that are preferably performed by an interrupt program when the data processor 35 of FIG. 2 is interrupted at the sampling frequency $f_s$. A quotient $B_i^2$ and $F_i$ for each of the triplets of differences are computed by ratio computations 105, 106, 107 . . . 108 that are performed at a rate of one-third of the sampling frequency $f_s$. The 16 quotients $B_i^2$ and the 16 quotients $f_i$ are accumulated in digital filtering 109 that can be performed at various times over about 48 sampling periods T corresponding to the differences $x_1$ to $x_{48}$. The average values of the quotient $\overline{B}^2$ and $\overline{F}$ result from the digital filtering. A square root function 110 computes the amplitude estimate B from the average value of the quotient $\overline{B}^2$, and the frequency estimate f is computed by an arc-cosine function 111 from the average value of the quotient $\overline{F}$.

Also shown in FIG. 6 is a variable Q associated with the amplitude estimate B, and a variable q associated with the frequency estimate f. The variables Q and q indicate, respectively, the number of the quotient values $B_i^2$ and $F_i$ that were actually averaged together by the digital filter 109 instead of being excluded because their associated denominator value $DEN_i$ or $den_i$, respectively, was relatively small. In contrast to FIGS. 4 and 5, where the exclusion condition was a certain fraction of an average value of $DEN_i$ or $den_i$, respectively, the digital filter 109 preferably rejects quotients when the value of DEN or den falls below a respective predetermined threshold value. In the system of FIG. 3, for example, the amplitude estimate B or the frequency estimate f should fall within certain predetermined limits, so that the threshold can be set at a certain fraction of the average value expected for any healthy signal. The threshold value is not critical and can be determined by simple trial and error for a particular system.

Listed below is an example program that performs the functions shown in FIG. 6 and which corresponds to the amplitude and frequency estimator program 36 and the health monitoring program 37 of FIG. 2. In particular, in the listing below, there is shown a main program called "MONITOR" that operates the analog multiplexer 30 of FIG. 2 to scan among three signals. Upon outputting a new select signal to the multiplexer 30, the program MONITOR waits 30 microseconds for the analog-to-digital converter 32 to sample the new signal. Then the program MONITOR calls a routine called TESTSIG in order to test whether the amplitude and frequency of the selected signal are within predetermined limits. If not, the program MONITOR displays an error code provided by the TESTSIG routine, and then the program MONITOR selects another signal for processing.

The TESTSIG routine initializes a number of variables used by a 42 kHz interrupt routine corresponding to the amplitude and frequency estimator program 36 of FIG. 2. After initializing these variables, the TESTSIG routine enables a 42 kHz interrupt so that the amplitude and frequency estimator program processes the signal samples from the analog-to-digital converter 32 in FIG. 2. The routine TESTSIG polls a variable NUMC to determine when the amplitude and frequency estimator program is finished. When NUMC is greater or equal to 16, then the amplitude and frequency estimator program 36 is finished. The TESTSIG routine then compares the variables Q and q to predetermined minimum limits QMIN and qmin, and also compares the amplitude estimate B and the frequency estimate f to respective predetermined minimum and maximum limits. An error indication is produced when any one of the variables Q, q, B, or f is outside of a boundary set by a respective one of the limits.

The 42 kHz interrupt routine inputs one sample during each interrupt and classifies the sample as either case0, case1, case2, or case3. Case0 corresponds to the very first sample S1, and the other three cases correspond to one of the samples that permits the computation of either a first difference, a second difference, or a third difference, respectively, for each of the triplets of differences. When a triplet of differences has been accumulated, then the computations depicted in FIG. 3 are performed for the triplet to compute a quotient $B_i^2$ and $F_i$ for the triplet. Also included in the program listing are examples of functions for computing the ratios, the square roots, and the arc-cosines by the polynomial approximations as derived in Appendices I, II, and III.

```
MONITOR      SELECT ← SELECT +1
             IF SELECT > 3 THEN SELECT ← 1
             OUTPUT SELECT
             WAIT 30 MICROSECONDS
             CALL TESTSIG
             IF ERROR > 0 THEN GOTO 10
             B(SELECT) ← SQRT(BS)
*** NOTE:    K = ½πT
             f(SELECT) ← K*ACOS(F)
             RETURN
  10         DISPLAY(ERROR)
             RETURN
TESTSIG      ERROR ← 0
             CASE ← 0
             NUMC ← 0
             BS ← 0
             F ← 0
             Q ← 0
             q ← 0
             ENABLE 42 kHz INTERRUPT
 110         IF NUMC < 16 THEN GOTO 110
             IF Q ≥ QMIN    THEN GOTO 120
             ERROR ← 1
             RETURN
 120         BS ← BS/Q
             IF BS ≤ BSMAX  THEN GOTO 130
             ERROR ← 2
             RETURN
 130         IF BS ≥ BSMIN  THEN GOTO 140
             ERROR ← 3
             RETURN
 140         IF q ≥ qmin    THEN GOTO 150
             ERROR ← 4
             RETURN
             F ← F/q
 150         F ≤ FMAX   THEN GOTO 160
             ERROR ← 5
             RETURN
 160         IF F ≥ FMIN    THEN RETURN
             ERROR ← 6
             RETURN
42KHZINT     INPUT SAMPLE
             IF CASE > 0    THEN GOTO 210
             S1 ← SAMPLE
             CASE ← 1
             RETURN
 210         IF CASE > 1    THEN GOTO 220
             X1 ← S1 - SAMPLE
             S1 ← SAMPLE
             CASE ← 2
             RETURN
 220         IF CASE > 2    THEN GOTO 230
             X2 ← S1 - SAMPLE
             S1 ← SAMPLE
             CASE ← 3
             RETURN
 230         X3 ← S1 - SAMPLE
             S1 ← SAMPLE
             CASE ← 1
             num ← X1 + X3
             PRODX1X3 ← X1 * X3
             NUMC ← NUMC + 1
             IF NUMC ≥ 16    THEN GOTO 240
             CLEAR INTERRUPT MASK
             GOTO 250
 240         DISABLE 42 KHZ INTERRUPT
 250         SQX2 ← X2 * X2
             CUBX2 ← SQX2*X2
             den ← LEFT SHIFT X2 BY 1
             SUMnd ← num + den
             DEN ← den - num
             DEN ← DEN*DEN
             DEN ← DEN*SUMnd
             NUM ← SQX2 - PRODX1X3
             NUM ← NUM*CUBX2
             LEFT SHIFT NUM BY 2
             IF den < denmin      THEN GOTO 260
             F ← F + RATIO(num,den)
             q ← q + 1
             IF DEN < DENMIN      THEN GOTO 270
             BS ← BS + RATIO(NUM,DEN)
             Q ← Q + 1
 270         RETURN
FUNCTION     RATIO (T/U)
*** NOTE:
*** B0 =         0.8946079612
*** B1 =        -0.3153155446
*** B2 =         0.0547355413
*** B3 =        -0.0046808124
*** B4 =         0.0001578331
             RATIO ← U*B4
             RATIO ← RATIO + B3
             RATIO ← RATIO * U
             RATIO ← RATIO + B2
             RATIO ← RATIO * U
             RATIO ← RATIO + B1
             RATIO ← RATIO * U
             RATIO ← RATIO + B0
             RATIO ← RATIO * T
             RETURN
FUNCTION          SQRT(V)
*** NOTE:
*** A0 =         0.5439969897
*** A1 =         0.5490743518
*** A2 =        -0.0689262748
*** A3 =         0.0068873167
*** A4 =        -0.0003057122
             SQRT ← V * B4
             SQRT ← SQRT + B3
             SQRT ← SQRT * V
             SQRT ← SQRT + B2
             SQRT ← SQRT * V
             SQRT ← SQRT + B1
             SQRT ← SQRT * V
             SQRT ← SQRT + B0
             RETURN
FUNCTION     ACOS(w)
*** NOTE:
*** C0 =         0.0500000119
*** C1 =        -0.6684602499
```

11

-continued

```
*** C2 =      -0.1108554006
*** C3 =      -0.0580515265
              SQW ← W * W
              ACOS ← SQW * C3
              ACOS ← ACOS + C2
              ACOS ← ACOS * SQW
              ACOS ← ACOS + C1
              ACOS ← ACOS * W
              ACOS ← ACOS + C0
              RETURN
```

12

Finally, shown in Appendix IV is a computer program for evaluating the performance of various embodiments of the present invention.

In view of the above, there has been described a method for estimating the amplitude and phase of a biased and sparsely-sampled sinusoidal signal. The method can give accurate results from a small number of samples, with only a modest amount of computation. Therefore, the method is easily implemented by a data processor programmed for estimating the amplitude and frequency of a number of analog signals scanned by an analog multiplexer and digitized by an analog-to-digital converter.

---

APPENDIX I.

MATHCAD (Trademark) PROGRAM
CHEBYCHEV APPROXIMATION FOR DIVISION
USING THE REMEZ-EXCHANGE ALGORITHM
QRSDIVIDE.MCD

---

We form the quotient x/y by evaluating 1/y and multiplying the result by x. The objective of this program is to calculate the "b" coefficients that provide the Chebychev solution to 1/y.

INITIALIZE $Y_{nom} := 6$                                                          Nominal value of the input variable.

$\delta Y := \frac{1}{3} \cdot Y_{nom}$                                  Tolerance on the input variable.

$Y_{max} := Y_{nom} + \delta Y$                                          $Y_{max} = 8$ Maximum anticipated input value.

$Y_{min} := Y_{nom} - \delta Y$                                          $Y_{min} = 4$ Minimum anticipated input value.

$B := 24$                                                                Number of bits of coefficient resolution.

$N := 5$                                                                 Number of ocefficients in data-fitting routine. (This is determined by trial and error.)

$n := 0 \ldots N$                                                        Coefficeint index.
$m := 0 \ldots N$                                                        The y-value index.
$p := 0 \ldots N - 1$                                                    The weighting-coefficient ("b") index.

$K := 1000$                                                              Number of performance-evaluation points.

$k := 0 \ldots K - 1$                                                    Performance-evaluation index.
PRINTCOLWIDTH := 10                                                      PRNPRECISION := 10
ZERO := 0                                                                WRITEPRN(YA) := ZERO □
    m                                                                    WRITE(COUNT) := 0 □
TYPE "PROCESS", COMMENT "WRITEPRN(YA)" & "WRITE(COUNT)", THEN
GOTO 125.
ITERATION := READ(COUNT) WRITE(COUNT) := 1 + ITERATION

YA := READPRN(YA)

$Y_m := \text{if}\left[ \text{ITERATION} \approx 0, Y_{min} + [Y_{max} - Y_{min}] \cdot \frac{m}{N}, YA_m \right]$    The extremal values of the independent variable, y.

$M_{m,n} := \text{if}[n \approx N, (-1)^m, Y_m^n]$                        The Remez matrix.

$y_k := Y_{min} + [Y_{max} - Y_{min}] \cdot \frac{k}{K - 1}$              The performance-evaluation variable.

$R := \left[ \overline{\frac{1}{Y}} \right] \quad REF := \left[ \overline{\frac{1}{y}} \right]$    R is the functional reference vector; REF is the performance-reference vector.

$v := M \cdot R \quad \epsilon := v_N$                                   v is the solution vector; $\epsilon$ is the error measure.

$b_p := 2^{-B} \cdot \text{floor}[0.5 + 2^B \cdot V_p]$                   The coefficient vector rounded to B bits.
                                                                      WRITE PRN(BCOEFF) := b

PERFORMANCE EVALUATION

-continued

APPENDIX I.

$$AF := \overline{\left[\sum_p b_p \cdot y^p\right]}$$

The approximating function.

ERROR := REF − AF
The performance error.
The plot of the error-extremal envelope bounded by ε':
ε' := if[ε ≈ 0,max[(|ERROR|)],|ε|]   Another index i := 0 ... 1
This is the error-extremal envelope plot:
$EY_k$ := if[k ≈ K − 1,0,if[$ERROR_{k+1}$ ≥ $ERROR_k$,ε',−ε']]
This filter (MASK) is used to locate the frequencies
corresponding to all extremal error values plus the end points:
$MASK_k$ := if[k ≈ 0,1,if[k ≈ K − 1,1,if[$EY_{k+1}$ ≈ −$EY_k$,1,0 ]]]
This is the actual frequency-filtering operation. The only
frequencies that get through are the end points plus those
where error extrema are located.
$MATRIX_{k,0}$ := $y_k \cdot MASK_k$   $MATRIX_{k,1}$ := $|ERROR_k| \cdot MASK_k$
Extract the frequencies where the N+1 largest end-point values
and extremal values are located, sort them, and write them into
memory:
$MYE_{m,i}$ := reverse(csort(MATRIX,1))$_{m,i}$   SYE: = (csort(MYE,0))
|ε| = 5.42 $10^{-5}$   WRITEPRN(YA) := $SYE^{<0>}$
max $\overline{[(|ERROR|)]}$ − |ε| = 1.25 $10^{-5}$ A sanity check.

$$\text{floor}\left[\frac{-\log[\max\overline{[(|ERROR|)]}]}{\log(2)}\right] = 13$$

Accuracy performance level
measured in bits.
Compute the peak error in
ppm

Now plot the functions and the
error

Max $\overline{[(|ERROR|)]} \cdot 10^6 = 66.7$

List the extremal frequencies
(col 0), and the extremal value
magnitudes (col 1):

The rounded coefficients:

The hex coefficients:

$$SYE = \begin{vmatrix} 4 & 0.0000522733 \\ 4.3283283283 & 0.0000564838 \\ 5.2452452452 & 0.0000502018 \\ 6.5025025025 & 0.0000612455 \\ 7.5635635636 & 0.0000433821 \\ 8 & 0.0000666976 \end{vmatrix}$$

$$b = \begin{vmatrix} 0.8946079612 \\ -0.3153155446 \\ 0.0547355413 \\ -0.0046808124 \\ 0.0001578331 \end{vmatrix}$$

$$\frac{\max[(|SYE^{<1>}|)]}{\min[(|SYE^{<1>}|)]} - 1 = 0.5374449341$$

$$2^B \cdot b = \begin{vmatrix} \text{e50507h} \\ -\text{50b885h} \\ \text{e0326h} \\ -\text{132c3h} \\ \text{a58h} \end{vmatrix}$$

END OF PROGRAM

---

CHEBYCHEV APPROXIMATION FOR SQUARE ROOT
USING THE RSAW 8/4/93 MEZ-EXCHANGE ALGORITHM
QRSSQRT. MCD

---

The objective of this program is to calculate the "a"
coefficients that provide a Chebychev polynomial approximation to
the square root of y.
The Chebychev solution is the one that minimizes the maximum
error of the approximation fit. There are no "surprise points"
in the solution space.

INITIALIZE $Y_{nom}$ := 2

Nominal value of the output variable.

δY := 0.1·$Y_{nom}$

Tolerance on the output variable.

$X_{max}$ := [$Y_{nom}$ + δY]$^2$ $x_{max}$ = 4.84 Maximum anticipated input value $X_{min}$ := [$Y_{nom}$ − δY]$^2$ $x_{min}$ = 3.24 Minimum anticitpated input value

B := 24

Number of bits of coefficients resolution.

N := 5

Number of coefficients in data-fitting routine. (This is determined by trial and -continued

APPENDIX I.

| | |
|---|---|
| $n := 0 \ldots N$ | Coefficient index. |
| $m := 0 \ldots N$ | The y-value index. |
| $p := 0 \ldots N - 1$ | The weighting-coefficient ("b") index. |
| $K := 1000$ | Number of performance-evaluation points. |
| $k := 0 \ldots K - 1$ | Performance-evaluation index. |
| PRINTCOLWIDTH := 10 | PRNPRECISION : = 10 |
| ZERO := 0 | WRITEPRN(YA) : = ZERO □ |
| $\overline{m}$ | WRITE(COUNT) : = 0 □ |

TYPE "PROCESS", COMMENT "WRITEPRN(XA)" & "WRITE(COUNT)", THEN GOTO 128.

SETUP

ITERATION := READ(COUNT) WRITE(COUNT) := 1 + ITERATION XA := READPRN (XA)

$$X_M := \text{if}\left[\overline{\text{ITERATION} \approx 0, X_{min} + [X_{max} - X_{min}] \cdot \frac{m}{n}, XA_m}\right]$$

The extreme values of the independent variable.

$$M_{m,n} := \text{if}[n \approx N, (-1)^m, x_m^n]$$

The Remez matrix.

$$x_k := x_{min} + [x_{max} - x_{min}] \cdot \frac{k}{K-1}$$

The performance-evaluation variable.

$$R := [\overline{\sqrt{X}}] \quad REF := [\overline{\sqrt{x}}]$$

R is the functional reference vector; REF is the performance-reference vector.

$v := M^{-1} \cdot R \quad \epsilon := v_N$ v is the solution vector; $\epsilon$ is the error measure $a_p := 2^{-B} \cdot \text{floor}[0.5 + 2^B \cdot V_p]$ The coefficient vector rounded to B bits.
WRITEPRN(ACOEFF) := a

PERFORMANCE EVALUATION $$AF := \left[\overline{\sum_p a_p \cdot x^p}\right]$$

The approximating function.

ERROR := REF − AF

The performance error.

The plot of the error-extremal envelope bounded by $\epsilon'$ :

Another index: i := 0 . . . 1

$\epsilon'$ : if$[\overline{\epsilon \approx 0, \max[(|ERROR|)], |\epsilon|}]$
This is the error-extremal envelope plot:
$EX_k := \text{if}[k \approx K - 1, 0, \text{if}[ERROR_{k+1} \geq ERROR_k, \epsilon', -\epsilon']]$
This filter (MASK) is used to locate the frequencies corresponding to all extremal error values, plus the end points:
$MASK_k := \text{if}[k \approx 0, 1, \text{if}[k \approx K - 1, 1, \text{if}[EX_{k+1} \approx -EX_k, 1, 0]]]$
This is the actual frequency-filtering operation. The only frequencies that get through are the end points plus those where extremal are located.
$MATRIX_{k,0} := x_k \cdot MASK_k \quad MATRIX_{k,1} := |ERROR_k| \cdot MASK_k$
Extract the frequencies where the N+1 largest end-point values and extremal values are located, sort them, and write them into memory.
$MXE_{m,i} := \text{reverse (csort(MATRIX,1))}_{m,i} \quad SXE := (\text{csort(MXE,0)})$
$-6 \quad <0>$
$|\epsilon| = 1.1 \, 10 \quad WRITEPRN(XA) := SXE$
$\max[\overline{(|ERROR|)}] - |\epsilon| = 3.41 \, 10^{-7}$ A sanity check.

$$\text{floor}\left[\frac{-\log[\max[\overline{(|ERROR|)}]]}{\log(2)}\right] = 19$$

Accuracy performance level measured in bits.

Now plot the functions and the error

Compute the peak error in ppm:
$\max[(|ERROR|)] \cdot 10^6 = 1.44$

List the extremal freqencies (col 0), and the extremal values (col 1):

The rounded coefficients are:

APPENDIX I.
-continued $$SXE = \begin{vmatrix} 3.24 & 0.0000010195 \\ 3.384144141 & 0.0000011859 \\ 3.7669269269 & 0.0000009604 \\ 4.2682282282 & 0.0000013106 \\ 4.675035035 & 0.0000007948 \\ 4.84 & 0.0000014362 \end{vmatrix}$$

$$a = \begin{vmatrix} 0.4539969897 \\ 0.5490743518 \\ -0.0689262748 \\ 0.0068873167 \\ -0.0003057122 \end{vmatrix}$$

$$\frac{\max[|SXE^{<1>}|]}{\min[|SXE^{<1>}|]} - 1 = 0.8069951557$$

The hex coefficients:

$$2^B \cdot a = \begin{vmatrix} 8b4363h \\ 8c9023h \\ -11a527h \\ 1c35eh \\ -1409h \end{vmatrix}$$

END OF PROGRAM

APPENDIX III.

MATHCAD (Trademark) PROGRAM
CHEBYCHEV APPROXIMATION TO AN ARCCOSINE FUNCTION
QRSARCOSRMZ.MCD The objective of this program is to calculate the "a" coefficients that provide the Chebychev solution to the polynomial approximation of arccos(x). The application is a direct-reading frequency-deviation meter. We are going to estimate $\delta f/f_o$.

INITIALIZE

| | |
|---|---|
| $f_s := 42000$ | The sampling frequency. |
| $f_o := 10000$ | The nominal frequency. |
| $\delta f := 0.2 \cdot f_o$ | Maximum deviation of the variable to be estimated. |
| $Y_{max} := \cos\left[[f_o - \delta f] \cdot \frac{2 \cdot \pi}{f_s}\right]$ | Maximum value of the input variable $Y_{max} = 0.3653410244$. |
| $Y_{min} := \cos\left[[f_o + \delta f] \cdot \frac{2 \cdot \pi}{f_s}\right]$ | Minimum value of the input variable $Y_{min} = 0.222520934$. |
| $B := 24$ | Number of bits of coefficient resolution. |
| $N := 4$ | Number of coefficients in data-fitting routine. |
| $n := 0 \ldots N$ | Coefficient index. |
| $m := 0 \ldots N$ | The x-value index. |
| $p := 0 \ldots N - 1$ | The weighting-coefficient ("a") index. |
| $K := 1000$ | Number of performance-evaluation points. |
| $k := 0 \ldots K - 1$ | Performance-evaluation index. |
| PRINTCOLWIDTH := 10 | PRNPRECISION := 10 |
| ZERO := 0 | WRITEPRN(YA) := ZERO☐ |
| m | WRITE(COUNT) := 0☐ |

TYPE "PROCESS" COMMENT "WRITEPRN(YA)" & "WRITE(COUNT)", THEN "GOTO 140".

SETUP

ITERATION := READ(COUNT)    WRITE(COUNT) := 1 + ITERATION

YA := READPRN(YA)

$$Y_m := \text{if}\left[\text{ITERATION} \approx 0, Y_{min} + [Y_{max} - Y_{min}] \cdot \frac{m}{N}, YA_m\right]$$

The extremal values of the independent variable, y.

$$M_{m,n} := \text{if}[n \approx N, (-1)^m, \text{if}[n \approx 0, 1, Y_m^{2 \cdot n - n}]]$$

The Remez matrix.

$$y_k := Y_{min} + [Y_{max} - Y_{min}] \cdot \frac{k}{K - 1}$$

The performance-evaluation variable.

-continued
APPENDIX III.

$$R := \frac{f_s}{2 \cdot \pi \cdot f_o} \cdot \overline{acos(Y) - 1}$$

R is the functional reference vector; REF is the performance-reference vector.

$$REF := \frac{f_s}{2 \cdot \pi \cdot f_o} \cdot \overline{acos(y) - 1}$$

$v := M^{-1} \cdot R \quad \epsilon := v_N$ v is the solution vector; $\epsilon$ is the error measure.

$a_p := 2^{-B} \cdot floor[0.5 + 2^b \cdot v_p]$

The coefficient vector rounded to B bits.
WRITEPRN(CCOEFF) := a

PERFORMANCE EVALUATION $b_p := if[p \approx 0, 0, a_p]$ $$AF := a_0 + \overline{\left[\sum_p b_p \cdot y^{2 \cdot p - 1}\right]}$$

The approximating function.

ERROR := REF − AF

The performance error.

The plot of the error-extremal envelope bounded by $\epsilon'$:
$\epsilon' := if[\epsilon \approx 0, max[\overline{(|ERROR|)}], |\epsilon|] \quad$ Another index: $i := 0 \ldots 1$
$EY_k := if[k \approx K - 1, 0, if[ERROR_{k+1} \geq ERROR_k, \epsilon', -\epsilon']]$
This filter (MASK) is used to locate the frequencies corresponding to all extremal error values:
$MASK_k := if[k \approx 0, 1, if[k \approx K - 1, 1, if[EY_{k+1} \approx -EY_k, 1, 0]]]$
This is the actual filtering operation. The only frequencies that get through are those where error extrema are located.
$MATRIX_{k,0} := Y_k \cdot MASK_k \quad MATRIX_{k,1} := |ERROR_k| \cdot MASK_k$
Extract the frquencies where the N+1 largest extremal values are located, sort them, write them into memory, and list the rounded coefficients:
$MYE_{m,i} := reverse(csort(MATRIX,1))_{m,i} \quad SYE := (csort(MYE,0))$
$|\epsilon| = 5.02 \cdot 10^{-7}$
$max[\overline{(|ERROR|)}] - |\epsilon| = 1.58 \cdot 10^{-8}$ WRITEPRN(YA) := SYE$^{<0>}$
"Gut" insurance. (If you can't feel good about the solution, its probably wrong!)

$$floor\left[\frac{-\log[max\overline{[(|ERROR|)]}]}{\log(2)}\right] = 20$$

Accuracy performance level measured in bits.

Now plot the functions and the error $max[\overline{(|ERROR|)}] = 5.18 \cdot 10^{-7}$ The extremal values:

$$SYE = \begin{vmatrix} -0.0830581871 & 0.0000005136 \\ 0.0817079274 & 0.0000004898 \\ 0.2294089799 & 0.0000005165 \\ 0.3294455494 & 0.0000004871 \\ 0.3653410244 & 0.0000005183 \end{vmatrix}$$

The rounded coefficients:

$$a = \begin{vmatrix} 0.0500000119 \\ -0.6684602499 \\ 0.1108554006 \\ -0.0580515265 \end{vmatrix}$$

$$\frac{max\ \overline{[|SYE^{<1>}|]}}{min\ \overline{[|SYE^{<1>}|]}} - 1 = 0.0639659227$$

$$2^B \cdot a = \begin{vmatrix} ccccdh \\ -ab2036h \\ -1c6105h \\ -edc77h \end{vmatrix}$$

END of PROGRAM

APPENDIX IV.

MATHCAD (Trademark) PROGRAM
SIMPLE AND ROBUST QRS DRIVE-VOLTAGE
AMPLITUDE AND FREQUENCY ESTIMATION
QRSSINEAMPY.MCD

SUMMARY

This program introduces an algorithm that computes the peak

-continued

APPENDIX IV.

amplitude of the sparsely sampled noisy sinusoid riding on a dc offset. The algorithm uses only adds, multiplies, and shifts operating on sets of 4 contiguous samples. The inherent computational error is on the order of 15 ppm. The algorithm also estimates frequency; the inherent computational error is within 2 or 3 hundredths of a Hertz. Naturally, high noise levels degrade the performance.

SETUP AND DEFINITIONS

| | | |
|---|---|---|
| $K := 128$ | $k := 0 \ldots K - 1$ | Source-signal index |
| $L := K - 1$ | $l := 0 \ldots L - 1$ | Processed-signal index |
| $M := L - 2$ | $m := 0 \ldots M - 1$ | Signal-processing index |
| | $n := 0 \ldots M - 1$ | ... and another one. |
| $f_s := 42000$ | | Sampling frequency |

$T := \dfrac{1}{f_s}$  $T = 2.381 \cdot 10^{-5}$   Sampling period $A_o := 2$   A is the signal amplitude (the nominal value is Ao; we allow +/− 10% variation)

$A := A_o \cdot (1 + (-0.1 + \text{rnd}(0.2)))$   $A = 1.937$
$f_o := 10000$   Nominal signal frequency.
$f_o := f_o \cdot (1 + 0.2 \cdot (\text{rnd}(2) - 1))$   Signal frequency (Hz). A +/− 20% variation is allowed about the nominal.

$\Omega := 2 \cdot \Pi \cdot f_o$   Signal frequency (rad/sec)

$\phi := \text{rnd}(2 \cdot \Pi)$   $\phi = 5.266$   A completely arbitrary phase angle.

$U_k := A \cdot \sin(\Omega \cdot T \cdot k + \phi)$   QRS voltage sinusoidal-signal samples.

$\eta_k := 2 \cdot 10^{-3} \cdot (\text{rnd}(2) - 1)$   Now we generate some noise ...

$DC := -1 + \text{rnd}(2)$   $DC = -0.421$   ... and a DC offset (arbitrary) ...

$v := u + \eta + DC$   ... and add them to the signal in order to obtain the noisy and biased input voltage, v.

$SNR := 10 \cdot \log \left[ \dfrac{K}{2} \cdot \dfrac{A^2}{\sum_k \eta_k^2} \right]$   Signal-to-noise ratio (in dB) at the input: SNR = 61.

DEFINE SOME FUNCTIONAL APPROXIMATIONS

We use Chebychev (minimax solutions) polynomial approximations to the square root, division, and arccosine operations. The polynomial coefficients have been rounded to 24 bits. These coefficients are imported from the SQRT.MCD, DIVIDE.MCD, and ARCOSRMZ.MCD programs.

$a := \text{READPRN}(\text{ACOEFF})$   $b := \text{READPRN}(\text{BCOEFF})$   $i := 0 \ldots \text{last}(a)$ $a = \begin{bmatrix} 0.5439969897 \\ 0.5490743518 \\ -0.0689262748 \\ 0.0068873167 \\ -0.0003057122 \end{bmatrix}$   $b = \begin{bmatrix} 0.8946079612 \\ -0.3153155446 \\ 0.0547355413 \\ -0.0046808124 \\ 0.0001578331 \end{bmatrix}$ $\text{sqrt}(x) := \Sigma_i a_i \cdot x^i$
$\text{sgn}(y) := \text{if}(y \geq 0, 1, -1)$
$\text{div}(x,y) := \text{sgn}(y) \cdot x \cdot 2$ $2 - \text{floor}\left[ \dfrac{\log(|y|)}{\log(2)} \right] \cdot \Sigma_i b_i \cdot \left[ |y| \cdot 2^{-\text{floor}\left[ \dfrac{\log(|y|)}{\log(2)} \right]} \right]^i$ e.g., $\text{div}(12,3) = 4.001$
$\text{sqrt}(4) = 2$   $\text{sqrt}(\text{div}(12,3)) = 2$
$C := \text{READPRN}(\text{CCOEFF})$   nfd = normalized frequency deviation.

APPENDIX IV.

$$c = \begin{bmatrix} 0.0500000119 \\ -0.6684602499 \\ -0.1108554006 \\ -0.0580515266 \end{bmatrix}$$

Example:
$\text{nfd}[\cos[2 \cdot \pi \cdot f_o \cdot (1 + 0.1) \cdot T]] = 0.100001$

THE PROCEDURE

Our first step is to eliminate the DC offset by taking the difference between successive samples of the input signal. The input signal to the differencing operator is v, the signal after the differencing operator is x:
$x_1 := v_{1+1} - v_1$  The difference signal The estimates of A and frequency are $\text{EoA} := \sqrt{\dfrac{\text{NUM}}{\text{DEN}}}$  $\square$ $\text{Eof} := \dfrac{1}{2 \cdot \pi \cdot T}$ ─a Define;
$\text{NUM}_m := 4 \cdot x_{m+1}^3 \cdot [x_{m+1}^2 - x_m \cdot x_{m+2}]$
$\text{DEN}_m := [[2 \cdot x_{m+1}]^2 - [x_m + x_{m+2}]^2] \cdot [2 \cdot x_{m+1} - [x_m + x_{m+2}]]$
$\text{num}_m := x_{m+2} + x_m$   $\text{den}_m := 2 \cdot x_{m+1}$
In order to avoid division problems that arise if the denominators are too small, we define the "weeding-out" functions, p and q:
$p_m := \text{if}[|\text{DEN}_m| < 0.01 \cdot \max[(|\text{DEN}|)], 0, 1]$
$q_m := \text{if}[|\text{den}_m| < 0.01 \cdot \max[(|\text{den}|)], 0, 1]$
Now we compute the estimate of the square of A over several sets of samples, average those results, then take the square root:

$$\text{EoA} := \text{sqrt}\left[ \dfrac{p}{\Sigma p} \cdot \overline{[(\text{div}(\text{NUM}, \text{DEN}))]} \right]$$

and compute the amplitude-estimation error in ppm:

$\epsilon := \dfrac{|A - \text{EoA}|}{A} \cdot 10^6$    $\epsilon = 16.662$

We similarly estimate the frequency (the actual value is f'o)

$$\text{Eof} := f_o \cdot \left[ 1 + \text{nfd}\left[ \dfrac{q}{\Sigma q} \cdot \overline{\text{div}(\text{num}, \text{den})} \right] \right]$$    $\text{Eof} = 9937.361$
$f_o = 9937.135$ and determine the frequency-estimation error in Hertz:
$\epsilon f := f_0 - \text{Eof}$   $\epsilon f = -0.226$
We have been operating with a signal-to-noise ratio of SNR = 61.445 the phase angle is $\theta = 5.266$ the DC offset is DC = −0.421 the frequency is off nominal by f' − f = −62.865 and the amplitude is off by $A - A_o = -0.063$ o o.

END OF PROGRAM

I claim:

1. A method of obtaining and using an indication of a characteristic of an analog drive signal exciting an angular rate sensor, said method comprising the steps of:

a) exciting said angular rate sensor with said analog drive signal;

b) digitizing said drive signal in an analog-to-digital converter, thereby producing a sequence of sample values $(x_1, x_2, x_3, \ldots, x_n)$ at respective spaced instants of time;

c) computing in a computer operating pursuant to software a series of ratios of algebraic functions of triplets $(x_i, x_{i-1}, x_{i-2})$ of neighboring ones of said sample values;

d) computing in a computer operating pursuant to software an average of said ratios to produce said indication of said characteristic;

e) applying said indication of said characteristic to a correction signal generator to produce a correction signal; and f) subtracting, in an adder unit, the correction signal from an angular rate signal generated by said angular rate sensor to produce a corrected angular rate signal.

2. The method as claimed in claim 1, wherein:

(a) the indication of the characteristic is an estimate (B) of the amplitude;

(b) the signal is a sinusoidal signal represented as sample values $S_1, S_2, S_3, S_4$ at respective spaced instants of time;

(c) the number of sample values is four; and (d) $x_1$ is the difference between $S_2$ and $S_1$, $x_2$ is the difference between $S_3$ and $S_2$, and $x_3$ is the difference between $S_4$ and $S_3$.

3. The method as claimed in claim 2, wherein said step of computing an estimate (B) of said amplitude is performed by i) computing a ratio of algebraic functions of said triplet of differences $x_1$, $x_2$, and $x_3$; and ii) computing said estimate (B) of said amplitude as a nonlinear function of said ratio of algebraic functions.

4. The method as claimed in claim 3, wherein said ratio of algebraic functions includes terms equivalent to:

$$\frac{x_n^3 (x_n^2 - x_{n+1} x_{n-1})}{[2x_n - (x_{n+1} + x_{n-1})]^2 [(2x_n) + (x_{n+1} + x_{n-1})]}.$$

5. The method as claimed in claim 4, wherein said nonlinear function includes a polynomial approximation of a square root function.

6. The method as claimed in claim 2, wherein each of said steps (a) and (b) are performed by a data processor under program control.

7. The method as claimed in claim 2, further comprising the step of computing a correction value from said estimate (B) of the amplitude of said sinusoidal signal for compensating a parasitic capacitance in an electrical circuit.

8. The method as claimed in claim 1, wherein:
   (a) the indication of the characteristic is an estimate (F) of the frequency;
   (b) the signal is a sinusoidal signal represented as sample values $S_1$, $S_2$, $S_3$, $S_4$ at respective spaced instants of time;
   (c) the number of sample values is four; and
   (d) $x_1$ is the difference between $S_2$ and $S_1$, $x_2$ is the difference between $S_3$ and $S_2$, and $x_3$ is the difference between $S_4$ and $S_3$.

9. The method as claimed in claim 8, wherein said step of computing an estimate (F) of said frequency is performed by
   i) computing a ratio of algebraic functions of said differences $x_1$, $x_2$, and $x_3$; and
   ii) computing said estimate (F) of said frequency as a nonlinear function of said ratio of algebraic functions.

10. The method as claimed in claim 9, wherein said ratio of algebraic functions includes terms equivalent to:

$$\frac{x_{n+1} + x_{n-1}}{x_n}.$$

11. The method as claimed in claim 10, wherein said nonlinear function includes a polynomial approximation of an arc-cosine function.

12. The method as claimed in claim 8, wherein each of said steps (a) and (b) are performed by a data processor under program control.

13. The method as claimed in claim 1, wherein:
   (a) a plurality of analog signals are produced at a like plurality of locations within an electronic circuit, one location for each respective signal;
   (b) the plurality of signals are applied to an analog multiplexer which has a like plurality of inputs, one for each respective signal, and which further has an analog output and a selection control input;
   (c) the analog output is connected to an input of an analog-to-digital converter which has a digital output;
   (d) the digital output is connected to an input port of a programmed data processor which has a first output port connected to the selection control input of the analog multiplexer;
   (e) the programmed data processor has a second output port which is connected to an output unit for indicating an error condition to an operator; and
   (f) the programmed data processor is programmed to:
      (1) output selection control signals to the analog multiplexer for conversion of each of the analog signals to a respective series of digital values by the analog-to-digital converter;
      (2) input into the programmed data processor the respective series of digital values for each of the analog signals;
      (3) determine an indication of amplitude and an indication of frequency of each of the analog signals by computing ratios of algebraic functions of at least four samples in the respective series of digital values for each of the analog signals; and
      (4) compare the indication of amplitude and the indication of frequency to limit values to indicate the error condition through the second output port when one of the indications of amplitude and frequency falls outside a boundary set by one of the limit values.

14. The method as claimed in claim 13, wherein said programmed data processor as programmed to compute said ratios of algebraic functions by computing a triplet of differences between successive values in each of said series of at least four samples, and by computing one of said ratios of algebraic functions indicative of amplitude from said triplet of differences, and computing one of said ratios of algebraic functions indicative of frequency from said triplet of differences.

15. The method as claimed in claim 14, wherein said programmed data processor is programmed to average together a plurality of said ratios of algebraic functions to compute said indication of amplitude, and to average together a plurality of said ratios of algebraic functions to compute said indication of frequency.

16. The method as claimed in claim 15, wherein said ratios of algebraic functions include algebraic functions which determine values for a denominator of each of said ratios of algebraic functions, and wherein said programmed data processor is programmed to exclude from said averages any ratios having a value for the denominator having a magnitude that is less than a limit value.

17. The method as claimed in claim 1, wherein each of said ratios has a denominator determined by a first one of said algebraic functions, and a numerator determined by a second one of said algebraic functions, and wherein said method further includes computing a value for said first one of said algebraic functions for each of said triplets, and excluding from said average any of said ratios for each of said triplets having a value for said first one of said algebraic functions that has a magnitude less than a threshold value.

18. The method as claimed in claim 17, wherein said threshold value is constant for each of said triplets.

19. The method as claimed in claim 17, wherein said threshold value is an average value of previously-computed values for said first one of said algebraic functions.

20. The method as claimed in claim 17, wherein said triplets are non-overlapping such at no two of said triplets both include any one of said sample values.

21. The method as claimed in claim 1, wherein the three samples values ($x_i$, $x_{i-1}$, $x_{i-2}$) in each of said triplets are computed from four sample values ($S_j$, $S_{j-1}$, $S_{j-2}$, $S_{j-3}$) representing another signal, such that $x_i$ is a difference between $S_j$ and $S_{j-1}$, $x_{i-1}$ is a difference between $S_{j-1}$ and $S_{j-2}$, and $x_{i-2}$ is a difference between $S_{j-2}$ and $S_{j-3}$.

22. The method as claimed in claim 1, further comprising the steps of comparing said average value to a predetermined limit value, and when said predetermined limit value is exceeded, reporting an error condition to an operator.

23. The method as claimed in claim 1, wherein said ratio includes terms equivalent to:

$$\frac{x_n^2 (x_n^2 - x_{n+1}) x_{n-1}}{4x_n^2 - (x_{n+1} + x_{n-1})^2}$$

so that said ratio is an indication of amplitude of said signal when said signal is sinusoidal.

24. The method as claimed in claim 1, wherein said ratio includes terms equivalent to:

$$\frac{x_{n+1} + x_{n-1}}{x_n}$$

so that said ratio is an indication of frequency of said signal when said signal is sinusoidal.

25. The method as claimed in claim 1, wherein the three samples values ($x_i$, $x_{i-1}$, $x_{i-2}$) in each of said triplets are computed from four sample values ($S_j$, $S_{j-1}$, $S_{j-2}$, $S_{j-3}$) representing another signal, such that $x_i$ is a difference between $S_j$ and $S_{j-1}$, $x_{i-1}$ is a difference between $S_{j-1}$ and $S_{j-2}$, and $x_{i-2}$ is a difference between $S_{j-2}$ and $S_{j-3}$; and wherein said ratio includes terms equivalent to:

$$\frac{x_n^3 (x_n^2 - x_{n+1} x_{n-1})}{[2x_n - (x_{n+1} + x_{n-1})]^2 [(2x_n) + (x_{n+1} + x_{n-1})]}$$

so that said ratio is an indication of amplitude of a sinusoidal signal, when said another signal represents said sinusoidal signal superimposed on a DC bias.

26. The method as claimed in claim 1, wherein each of steps (a) and (b) are performed by a data processor under program control.

* * * * *